(12) United States Patent
Kodera et al.

(10) Patent No.: US 6,338,893 B1
(45) Date of Patent: Jan. 15, 2002

(54) CONDUCTIVE PASTE AND CERAMIC PRINTED CIRCUIT SUBSTRATE USING THE SAME

(75) Inventors: Eiji Kodera, Gifu; Hitoshi Nagura, Aichi; Hironori Sato, Aichi; Shigeru Taga, Aichi, all of (JP)

(73) Assignee: NGK Spark Plug Co., Ltd., Aichi-ken (JP)

(*) Notice: Subject to any disclaimer, the term of this patent is extended or adjusted under 35 U.S.C. 154(b) by 0 days.

(21) Appl. No.: 09/425,805

(22) Filed: Oct. 25, 1999

(30) Foreign Application Priority Data

Oct. 28, 1998 (JP) .......................... 10-346535
Sep. 2, 1999 (JP) .......................... 11-248536

(51) Int. Cl.$^7$ ................................ B32B 3/00
(52) U.S. Cl. .................. 428/210; 428/901; 174/251; 252/514; 252/515
(58) Field of Search ................. 428/210, 901; 174/257; 252/514, 515

(56) References Cited

U.S. PATENT DOCUMENTS 2,993,815 A * 7/1961 Treptow ............ 428/209
4,514,321 A * 4/1985 Sinta ................ 252/512
4,695,403 A * 9/1987 Nishimura et al. ....... 252/513

FOREIGN PATENT DOCUMENTS

| JP | Hei-4-88067 | 3/1992 |
| JP | Hei-5-14363 | 2/1993 |
| JP | Hei-5-74166 | 10/1993 |
| JP | Hei-6-50705 | 6/1994 |
| JP | Hei-9-74256 | 3/1997 |
| JP | Hei-9-198919 | 7/1997 |

* cited by examiner

Primary Examiner—Cathy Lam
(74) Attorney, Agent, or Firm—Brinks Hofer Gilson & Lione

(57) ABSTRACT

A ceramic printed circuit substrate includes a glass ceramic substrate and a surface circuit pattern, which is formed on the substrate by use of a conductive paste. The conductive paste contains conductive components of silver and platinum and filler components of molybdenum, tungsten, manganese dioxide, silicon dioxide and copper oxide. A ceramic green sheet and a surface circuit pattern formed thereon by use of the conductive paste are simultaneously fired at a temperature not higher than 1000° C., thereby yielding the ceramic printed circuit substrate.

6 Claims, 6 Drawing Sheets

CONDUCTIVE PASTE AND CERAMIC PRINTED CIRCUIT SUBSTRATE USING THE SAME

BACKGROUND OF THE INVENTION

1. Field of the Invention

The present invention relates to a conductive paste used for a ceramic printed circuit substrate formed of a glass ceramic and to a ceramic printed circuit substrate that uses a conductive paste as material for a printed circuit.

2. Description of the Related Art

Given recent trends toward increasingly compact and higher performance electronic apparatus, it is apparent that demands for further compactness and further improvement in electric characteristics of electronic components and printed circuit substrates will become more severe. Conventionally, a sequential lamination process and a simultaneous lamination process have been employed in order to attain compactness of electronic components and printed circuit substrates. The sequential lamination process repeats a step of printing circuits on an insulation layer and a subsequent firing step. According to the simultaneous lamination process, ceramic green sheets on which circuits are printed by use of a conductive paste are laminated and are then fired simultaneously.

The simultaneous lamination process, which involves simultaneous firing, uses a ceramic material, such as alumina or lead titanate, as an insulator. Since a firing temperature for such a ceramic material is 1000° C. or higher, a wiring material must be a metal having a melting point not lower than 1000° C., such as tungsten or palladium. These high melting point metals have a high electrical resistivity and thus involve a drawback in that an electric signal flowing through a conductor of such a metal suffers a large loss (so-called conductor loss). As a result, electronic components and printed circuit substrates using these materials encounter difficulty in satisfying market demands for electric characteristics.

In order to meet market demands that are becoming increasingly severe, there have been developed various kinds of electronic components and printed circuit substrates that use a low firing temperature material, which can be fired at a temperature not higher than 1000° C., and that allow use of a conductor material having low electrical resistivity, such as silver, gold, or copper. Particularly, since silver has low electrical resistivity and can be fired in an oxidizing atmosphere, in distinction from copper, the technology of simultaneous firing of silver and a low firing temperature material has been studied and developed, thereby improving electric characteristics of ceramic printed circuit substrates.

However, silver involves problems in relation to reliability. Specifically, circuit lines of silver are apt to suffer solder erosion, and silver ions migrate and cause a short circuit between circuit lines. Accordingly, a printed circuit substrate has not been able to employ a surface circuit pattern formed of silver. Conventionally, a surface circuit pattern of silver is plated with, for example, nickel, in order to prevent solder erosion during, for example, solder mounting of a printed circuit substrate on another board or mounting of an integrated circuit chip on the printed circuit substrate. However, this plating practice involves a problem in that pretreatment by means of a chemical solution, such as acid or alkali, impairs adhesion of conductors to the substrate. Also, employment of the plating step involves a corresponding increase in cost.

Use of a silver-palladium conductor or silver-platinum conductor is effective for solving problems involved in using a silver conductor, such as solder erosion and migration of silver ions. The silver-palladium and silver-platinum conductors are obtained through addition to silver of palladium or platinum having high heat resistance. The palladium concentration of the silver-palladium conductive material is 5 to 30%, and the platinum concentration of the silver-platinum conductive material is 0.1 to 5%. These conductive materials are often used in the form of a conductive paste that undergoes postfiring metallization in a thick-film process. Postfiring in the thick-film process is performed after a conductive paste is applied to a fired substrate in a defined circuit pattern through printing and is adapted to fire the applied conductor at a temperature not higher than the substrate firing temperature.

The technology of forming a surface circuit pattern through postfiring of a thick-film process is disclosed in, for example, the following publications. Japanese Patent Application Laid-Open (kokai) No. 4-88067 discloses a conductive paste formulated through addition of an oxide of manganese, chromic oxide, and glass frit to a silver-palladium material. This disclosed conductive paste yields the effect of improving bonding strength and solder wettability of a surface circuit pattern that has undergone high-temperature aging. Japanese Patent Publication (kokoku) No. 6-50705 discloses a conductive paste formulated through addition of silicon dioxide and glass frit to silver. This disclosed conductive paste yields the effect of improving bonding strength and solder erosion resistance of a surface circuit pattern. Japanese Patent Publication (kokoku) No. 5-14363 discloses a conductive paste formulated through addition to silver of bismuth oxide, copper oxide, manganese dioxide and glass frit. This disclosed conductive paste yields the effect of improving bonding strength and solder erosion resistance of a surface circuit pattern. Since the disclosed techniques employ postfiring of a thick-film process for formation of a surface circuit pattern, a corresponding increase in labor is involved, causing an increase in fabrication cost. Since glass frit is softened during firing and stagnates between conductor particles, when the surface of a conductor layer is eroded by solder, a conductor surface having glass portions appears, with the result that the solder is repelled. Since a silver-palladium material has a relatively high electrical resistivity, a surface circuit pattern formed of the material involves a problem in that an electric signal suffers a relatively large conductor loss.

In order to reduce fabrication cost, the technique for simultaneously firing a surface circuit pattern formed of a silver-based material and a substrate has been studied. In contrast to the above-mentioned thick-film process, not many disclosed inventions employ a simultaneous firing process for forming a surface circuit pattern on a substrate. The simultaneous firing process in this context is disclosed in, for example, Japanese Patent Application Laid-Open (kokai) Nos. 9-198919 and 9-74256 and Japanese Patent Publication (kokoku) No. 5-74166. Japanese Patent Application Laid-Open Nos. 9-198919 and 9-74256 disclose a printed circuit substrate that uses a conductive paste formulated through addition of vanadium pentoxide to silver, thereby improving bonding strength and solder wettability of a surface circuit pattern, as well as warp resistance of the substrate. Japanese Patent Publication No. 5-74166 discloses a conductive paste formulated through addition of molybdenum and/or tungsten to a noble metal, such as silver, palladium, or platinum. This disclosed conductive paste yields the effect of improving solder wettability of a surface circuit pattern.

Even when a surface circuit pattern is formed of a silver-platinum conductor in an attempt to reduce the electrical resistivity of the surface circuit pattern and to improve resistance of the surface circuit pattern to soldering heat and solder erosion, the following problems arise. (1) Initial bonding strength of a circuit conductor is low; (2) the surface circuit pattern exhibits a significant deterioration of strength in an aging test conducted at a temperature as high as 150° C.; (3) the surface circuit pattern suffers solder erosion at a soldering heat resistance test conducted by use of a solder having a temperature as high as 260° C.; and (4) a mismatch in firing timing between the surface circuit pattern and the corresponding substrate causes warpage of the resultant printed circuit substrate.

A conceivable cause for the above problems (1) and (2) is described below. A substrate and a silver-platinum conductor are bonded together simply by means of a glass component that has thermally diffused from the substrate to the silver-platinum conductor during firing. Such a glass bond structure breaks easily when subjected to a mechanical or thermal action. When a conductive paste that contains glass frit is used as material for a circuit conductor, an excessive amount of glass appears on the surface of a circuit conductor during firing. Therefore, the conductive paste must not contain glass frit. In other words, the conductive paste of silver-platinum must contain a certain additive that replaces glass frit and can establish such a bond structure that does not easily break even when subjected to a mechanical or thermal action.

A conceivable cause for the above problem (3) is described below. Through addition to silver of platinum having high heat resistance, the resultant silver-platinum conductor exhibits heat resistance higher than that of simple silver. Even so, the silver-platinum conductor cannot resist silver's diffusing into solder having a temperature as high as 260° C. Accordingly, the conductive paste of silver-platinum must contain a certain additive that yields the effect of suppressing diffusion of silver into solder.

A conceivable cause for the above problem (4) is described below. The growth of silver particles begins in a low temperature region ranging from about 200° C. to about 300° C., whereas the substrate is formed of glass ceramic having a softening point not lower than 500° C. As a result, the timing of firing shrinkage of the substrate does not match that of silver. Accordingly, the conductive paste of silver-platinum must contain a certain additive that yields the effect of narrowing the gap between the timing of firing shrinkage of silver and that of the substrate.

SUMMARY OF THE INVENTION

In view of the foregoing, an object of the present invention is to provide a conductive paste that exhibits excellent performance in terms of initial bonding strength of a circuit conductor, solder wettability, deterioration upon subjection to high temperature aging, resistance to soldering heat of 260° C. and substrate warpage and to provide a ceramic printed circuit substrate using the conductive paste.

According to a first aspect of the present invention, a conductive paste comprises 100 parts by weight of silver-platinum; 0.2 to 1 part by weight of manganese dioxide; 0.2 to 1 part by weight of copper oxide; 0.3 to 1 part by weight of silicon dioxide; and 3 to 5.6 parts by weight of molybdenum and tungsten powder.

The above conductive paste yields the following effects. (1) Addition of manganese dioxide improves the resistance of a surface circuit pattern to soldering heat of 260° C. (2) Addition of silicon dioxide improves the aging characteristic of the surface circuit pattern as observed upon subjection to aging at a temperature as high as 150° C. (3) Addition of copper oxide improves the initial bonding strength of the surface circuit pattern. (4) Addition of molybdenum and tungsten powder reduces warpage of a substrate. (5) Absence of glass frit improves solder wettability.

According to a second aspect of the present invention, a conductive paste comprises 100 parts by weight of silver-platinum; 0.2 to 1 part by weight of manganese dioxide; 0.2 to 1 part by weight of copper oxide; 0.3 to 1 part by weight of silicon dioxide having a specific surface area of not less than 50 $m^2/g$ as measured by a BET method, an average primary grain size of 5 to 50 nm and a purity not lower than 99.8%; and 3 to 5.6 parts by weight of molybdenum and tungsten powder.

The above conductive paste yields the following effects. (1) Addition of manganese dioxide improves the resistance of a surface circuit pattern to soldering heat of 260° C. (2) Addition of silicon dioxide powder having the predetermined physical properties improves the aging characteristic of the surface circuit pattern as observed upon subjection to aging at a temperature as high as 150° C. As known among those in the art, during aging at 150° C., tin contained in solder (for example, a tin-lead eutectic solder) migrates through grain boundaries between silver and platinum and attacks a glass bond interface established by glass frit between a circuit portion and an insulation portion, thereby breaking a glass bond structure with a resultant deterioration in aging characteristic. Through addition to the conductive paste of silicon dioxide powder having the above physical properties, migration of tin is suppressed to thereby effectively improve the aging characteristic. (3) Addition of copper oxide improves the initial bonding strength of the surface circuit pattern. (4) Addition of molybdenum and tungsten powder reduces warpage of a substrate. (5) Absence of glass frit improves solder wettability.

According to a third aspect of the present invention, a ceramic printed circuit substrate comprises an insulation portion formed of glass ceramic containing lead borosilicate glass as a glass component and a circuit portion containing silver as a main component. At least part of the circuit portion is formed by use of a conductive paste comprising 100 parts by weight of silver-platinum, 0.2 to 1 part by weight of manganese dioxide, 0.2 to 1 part by weight of copper oxide, 0.3 to 1 part by weight of silicon dioxide, and 3 to 5.6 parts by weight of molybdenum and tungsten powder.

When a printed circuit is formed on the above-described green substrate (formed of glass ceramic containing lead borosilicate glass as a glass component) by use of the above-described conductive paste (comprises silver-platinum, manganese dioxide, silicon dioxide, copper oxide, and molybdenum and tungsten powder) and simultaneous firing is performed, the resultant ceramic printed circuit substrate exhibits excellent performance in terms of initial bonding strength of a circuit conductor, deterioration upon subjection to high temperature aging, resistance to soldering heat of 260° C. and substrate warpage, and enjoys high reliability and low fabrication cost. Glass ceramic containing lead borosilicate glass as a glass component exhibits relatively stable shrinkage behavior during firing. Thus, a difference in firing shrinkage between a circuit conductor and the corresponding substrate can be easily narrowed. Particularly, glass ceramic that contains as a glass component lead borosilicate glass, which has a softening point of 650° C. to 780° C., is preferred.

According to a fourth aspect of the present invention, a ceramic printed circuit substrate comprises an insulation portion formed of glass ceramic containing lead borosilicate glass as a glass component and a circuit portion containing silver as a main component. At least part of the circuit portion is formed by use of a conductive paste comprising 100 parts by weight of silver-platinum; 0.2 to 1 part by weight of manganese dioxide; 0.2 to 1 part by weight of copper oxide; 0.3 to 1 part by weight of silicon dioxide having a specific surface area of not less than 50 m$^2$/g as measured by a BET method, an average primary grain size of 5 to 50 nm and a purity not lower than 99.8%; and 3 to 5.6 parts by weight of molybdenum and tungsten powder.

When a printed circuit is formed on the above-described green substrate (formed of glass ceramic containing lead borosilicate glass as a glass component) by use of the above-described conductive paste (comprising silver-platinum, manganese dioxide, silicon dioxide powder having predetermined physical properties, copper oxide, and molybdenum and tungsten powder) and simultaneous firing is performed, the resultant ceramic printed circuit substrate exhibits excellent performance in terms of initial bonding strength of a circuit conductor, deterioration upon subjection to high temperature aging, resistance to soldering heat of 260° C., and substrate warpage, and enjoys high reliability and low fabrication cost. Particularly, through addition to the conductive paste of silicon dioxide powder having the above physical properties, an aging characteristic as observed upon subjection to aging at a temperature as high as 150° C. is effectively improved. Glass ceramic containing lead borosilicate glass as a glass component exhibits relatively stable shrinkage behavior during firing. Thus, a difference in firing shrinkage between a circuit conductor and the corresponding substrate can be easily narrowed. Particularly, glass ceramic that contains as a glass component lead borosilicate glass, which has a softening point of 650° C. to 780° C., is preferred.

The ceramic printed circuit substrates according to the third and fourth aspects are applied to, for example, electronic components, such as laminated LC filters, couplers (directional couplers), low-pass filter incorporated couplers, power distributors, baluns (balanced-to-unbalanced converters), mixer module substrates, PLL module substrates, VCOs (voltage-controlled oscillators), and TCXOs (temperature compensated crystal oscillators). The ceramic printed circuit substrates of the invention maintain a sufficiently high reliability even after subjection to a solder mounting step performed by use of a conventional eutectic solder and are sufficiently compatible with a solder mounting step performed by use of a leadless high melting point solder.

Application examples other than the above electronic components include ceramic printed circuit substrates equipped with electrode pads for electrical connection to a flip-chip bonding integrated circuit chip; specifically, so-called C4 (Controlled Collapse Chip Connection) packages and CSPs (Chip Size Packages). At least one component selected from among resistors, capacitors and inductors may be integrally mounted on these packages to form modules. The ceramic printed circuit substrates of the invention maintain sufficiently high reliability even after an integrated circuit chip is mounted thereon by use of a conventional eutectic solder and are sufficiently compatible with a step of mounting an integrated circuit chip thereon by use of a leadless high melting point solder, or a gold-tin brazing material.

DESCRIPTION OF PREFERRED EMBODIMENTS

Figure 1:
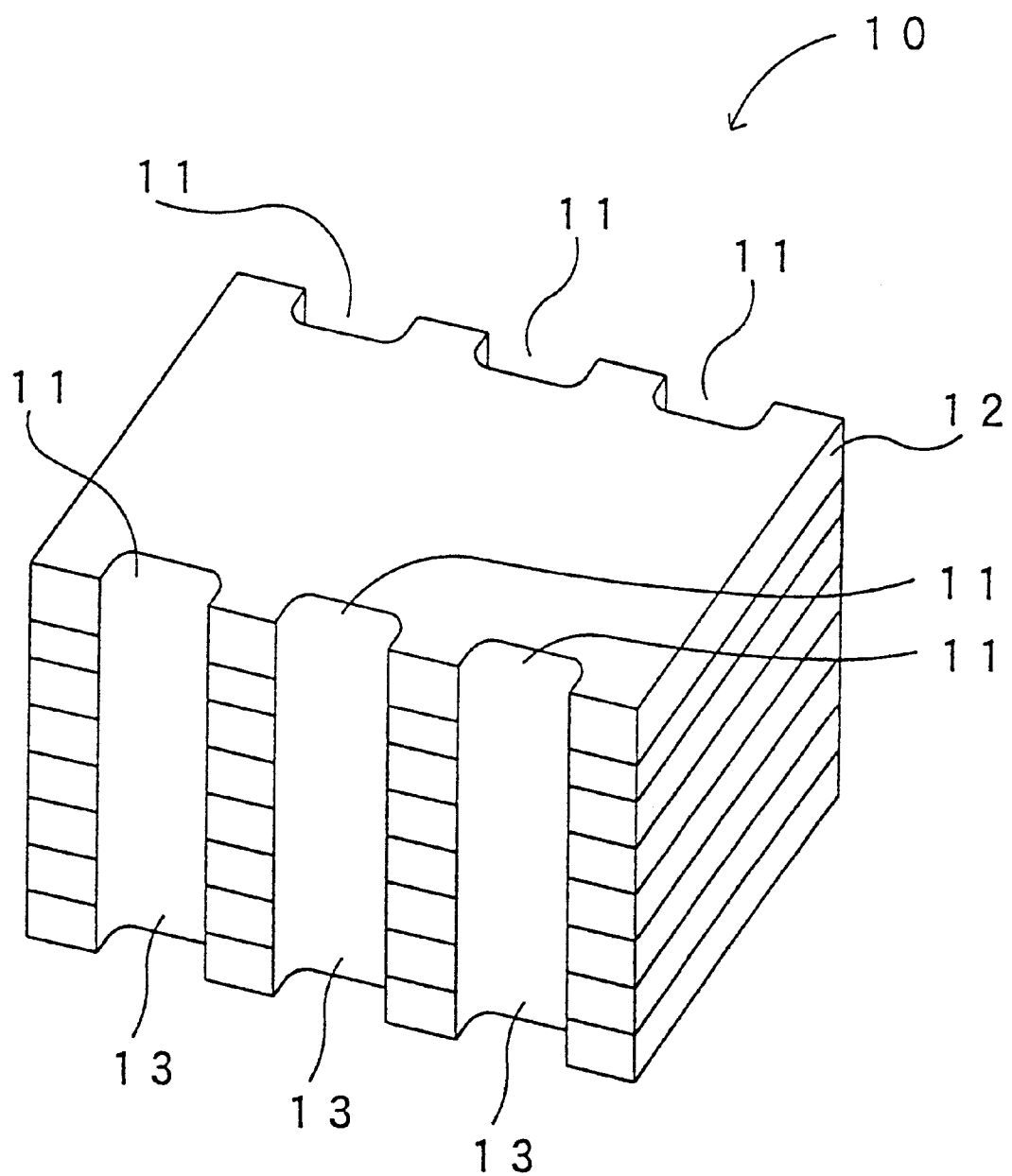
FIG. 1 is a schematic view showing a low-pass filter incorporated coupler to which the present invention is applied, for use in a cellular phone.

The present invention will next be described by way of examples, which should not be construed as limiting the invention.

EXAMPLES (1) Fabrication of Ceramic Green Sheets

A ceramic green sheet for a ceramic printed circuit substrate was fabricated according to the following method.

A lead borosilicate glass powder (composition: $SiO_2$ (49%), $Al_2O_3$ (5%), $B_2O_3$ (5%), $Na_2O$ (2.5%), $K_2O$ (1.5%), CaO (5%), and PbO (32%)) having a softening point of 678° C. and a commercially available α-alumina powder (Al-S43A, product of Sumitomo Chemical Co., Ltd.) were prepared as ceramic material. Ethyl methacrylate containing acrylic resin was prepared as an organic binder.

The above glass powder and alumina powder were placed in an alumina pot in a weight ratio of 1:1 to make 1 kg. Further, MEK (methyl ethyl ketone; 200 g) as a solvent, the above acrylic resin (100 g), DOP (dioctyl phthalate; 50 g) as a plasticizer, and a dispersant (5 g) were placed in the pot and mixed for 10 hours, yielding a slurry as material for a ceramic green sheet. The slurry was sheeted by a known doctor blade process, obtaining ceramic green sheets, each having a thickness of 0.4 mm.

(2) Preparation of Conductive Pastes of Silver-Platinum.

A silver powder (average grain size: 3 μm; 98 parts by weight) and a platinum powder (average grain size: 0.2 μm; 2 parts by weight) as conductive components, ethyl cellulose (5 parts by weight) and butyl carbitol (15 parts by weight) as binders, manganese dioxide (average grain size: 1 μm), copper oxide (average grain size: 1 μm), silicon dioxide (BET specific surface area: 380 m$^2$/g; average primary grain size: 7 nm; purity: 99.8% or higher), lead borosilicate glass frit used in the ceramic green sheet (average grain size: 2.5 μm); molybdenum (average grain size: 2.5 μm), and tungsten (average grain size: 0.6 μm) are mixed according to the composition of Tables 1 and 2. The resulting mixture of each kind of composition was kneaded by use of a three roll type mill, yielding a conductive paste.

(3) Fabrication of Sample Substrates

Four ceramic green sheets fabricated above in (1) were laminated under pressure, yielding a laminate. Surface circuit patterns were screen printed on the top surface of the laminate by use of the conductive paste formulated above in (2) such that each surface circuit pattern assumes a size of 2 mm square after firing. Subsequently, the laminate was fired at a retention temperature of 840° C. in the atmosphere. The thus-obtained sample substrates each measured 50 mm square×1.35 mm (thickness). A single substrate bears 100 surface circuit patterns, each measuring 2 mm square ×20 μm (thickness).

(4) Measurement of Substrate Warpage

The sample substrates fabricated above in (3) were measured for waviness of a silver-platinum circuit pattern by means of a surface roughness meter. The measured waviness was evaluated as a "warp" in a substrate. Specifically, the surface roughness meter traced the surface of the surface circuit pattern along the diagonal of the sample substrate to thereby obtain the amount of roughness. The thickness of the surface circuit pattern was subtracted from the obtained amount of roughness, obtaining the value of warp. A warp value of less than 40 μm was evaluated as acceptable. Table 1 contains measured values of warp. In the "warp" column of Table 2, symbol "A" indicates that a measured warp is less than 40 μm and is thus acceptable. Tables 1 and 2 also contain the results of various tests.

(5) Solder Wettability Test

The sample substrates fabricated above in (3) were dipped for 5 seconds in a solder bath that contains a molten tin-lead eutectic solder having a temperature of 230° C. to thereby place the solder on the conductor of a surface circuit pattern. The percentage of the area occupied by solder to the area of the silver-platinum circuit pattern was measured by use of an image processor. When the solder occupies not less than 95% of the area of the silver-platinum circuit pattern, solder wettability is evaluated as acceptable. The test results are shown in Tables 1 and 2.

(6) Soldering Heat Resistance Test

The sample substrates fabricated above in (3) were repeatedly dipped, for 10 seconds, in a solder bath that contains a molten tin-lead eutectic solder having a temperature of 260° C. to thereby place the solder on the conductor of the surface circuit pattern. After the first, third and fifth dipping operations, the sample substrates were checked for solder wettability. When sufficient wettability is observed, soldering heat resistance is evaluated as acceptable and is marked with symbol "A." When a circuit pattern disappears due to solder erosion, soldering heat resistance is evaluated as unacceptable or failure and is marked with symbol "F." The test results are shown in Tables 1 and 2.

(7) Bonding Strength Test

The sample substrates fabricated above in (3) were dipped for 5 seconds in a solder bath that contains a molten tin-lead eutectic solder having a temperature of 230° C. to thereby place the solder on the conductor of a surface circuit pattern. A nickel plated copper wire having a diameter of 0.5 mm was soldered to the surface circuit pattern covered with the solder. The soldered copper wire was pulled along a line normal to the substrate surface at a rate of 20 mm/min by use of a lead pull tester. Bonding strength as measured upon rupture between the substrate and the conductor of the surface circuit pattern was defined as the initial bonding strength. Then, the substrates were aged in the atmosphere within a constant temperature oven maintained at a temperature of 150° C. After 50 hour aging and after 500 hour aging, bonding strength was measured in a manner similar to that in the case of measurement of the initial bonding strength. Initial bonding strength not less than 3.9 kgf/2 mm square, bonding strength not less than 2.2 kgf/2 mm square as measured after 50 hour aging, and bonding strength not less than 1.0 kgf/2 mm square as measured after 500 hour aging are evaluated as acceptable. The test results are shown in Tables 1 and 2.

TABLE 1

| Sample No. | Composition of conductive paste (parts by weight) | | | | | | | Warp (μm) | Solder wettabiliy (%) | Soldering heat resistance (260° C. × 10 sec) | | | Bonding strength (kgf/2 mm square) | | |
|---|---|---|---|---|---|---|---|---|---|---|---|---|---|---|---|
| | Ag | Pt | MnO$_2$ | Bi$_2$O$_3$ | Lead borosilicate glass | Mo | W | | | 1 time | 3 times | 5 times | Initial | After 50 hr aging | After 500 hr aging |
| *1 | 98 | 2 | 0.1 | 0 | 0 | 0.05 | 3.0 | 40 | 100 | A | F | F | 2.58 | 2.10 | 0.86 |
| 2 | 98 | 2 | 0.2 | 0 | 0 | 0.05 | 3.0 | 36 | 100 | A | A | F | 4.08 | 2.28 | 1.05 |
| 3 | 98 | 2 | 0.3 | 0 | 0 | 0.05 | 3.0 | 33 | 100 | A | A | A | 4.37 | 2.76 | 1.18 |
| 4 | 98 | 2 | 0.6 | 0 | 0 | 0.05 | 3.0 | 32 | 100 | A | A | A | 4.24 | 2.47 | 1.21 |
| 5 | 98 | 2 | 0.9 | 0 | 0 | 0.05 | 3.0 | 7 | 100 | A | A | A | 4.35 | 2.74 | 1.12 |
| 6 | 98 | 2 | 1.0 | 0 | 0 | 0.05 | 3.0 | 10 | 95 | A | A | A | 4.43 | 2.88 | 1.28 |
| *7 | 98 | 2 | 1.2 | 0 | 0 | 0.05 | 3.0 | 12 | 70 | A | A | A | 4.51 | 3.10 | 1.35 |
| *8 | 98 | 2 | 0 | 0 | 0.3 | 0.05 | 3.0 | 40 | 75 | F | F | F | 4.40 | 2.99 | 0.88 |
| *9 | 98 | 2 | 0 | 0 | 0.6 | 0.05 | 3.0 | 41 | 60 | F | F | F | 3.09 | 3.02 | 1.55 |
| *10 | 98 | 2 | 0 | 0 | 0.9 | 0.05 | 3.0 | 35 | 40 | F | F | F | 3.99 | 2.11 | 0.87 |
| *11 | 98 | 2 | 0 | 0 | 1.2 | 0.05 | 3.0 | 33 | 30 | F | F | F | 3.56 | 1.89 | 1.10 |
| *12 | 98 | 2 | 0 | 0.3 | 0 | 0.05 | 3.0 | 33 | 100 | A | F | F | 3.07 | 2.95 | 0.88 |
| *13 | 98 | 2 | 0 | 0.6 | 0 | 0.05 | 3.0 | 50 | 75 | A | F | F | 4.25 | 2.19 | 0.84 |
| *14 | 98 | 2 | 0 | 0.9 | 0 | 0.05 | 3.0 | 31 | 50 | F | F | F | 3.82 | 2.78 | 0.89 |
| *15 | 98 | 2 | 0.9 | 0 | 0 | 0.04 | 2.4 | 130 | 100 | A | A | A | 4.37 | 2.65 | 1.18 |
| 16 | 98 | 2 | 0.9 | 0 | 0 | 0.8 | 4.8 | 10 | 95 | A | A | A | 3.94 | 2.59 | 1.09 |
| *17 | 98 | 2 | 0.9 | 0 | 0 | 1.0 | 5.0 | 8 | 75 | A | A | F | 3.46 | 1.94 | 0.78 |

Note:
Sample Nos. marked with * area of comparative examples.

TABLE 2

| Sample No. | Composition of conductive paste (parts by weight) | | | | | | | | Warp ($\mu$m) | Solder wettablity (%) | Soldering head resistance (260° C. × 10 sec) | | | Bonding strength (kgf/2 mm square) | | |
|---|---|---|---|---|---|---|---|---|---|---|---|---|---|---|---|---|
| | Ag | Pt | MnO$_2$ | CuO | SiO$_2$ | Lead boro-silicate glass | Mo | W | | | 1 time | 3 times | 5 times | Initial | After 50 hr aging | After 500 hr aging |
| 18 | 98 | 2 | 0.6 | 0.6 | 0.2 | 0 | 0.05 | 3 | A | 100 | A | A | A | 4.39 | 3.31 | 1.35 |
| 19 | 98 | 2 | 0.6 | 0.6 | 0.3 | 0 | 0.05 | 3 | A | 100 | A | A | A | 4.60 | 3.56 | 1.88 |
| 20 | 98 | 2 | 0.6 | 0.6 | 0.6 | 0 | 0.05 | 3 | A | 100 | A | A | A | 4.89 | 3.76 | 2.07 |
| 21 | 98 | 2 | 0.6 | 0.6 | 0.9 | 0 | 0.05 | 3 | A | 100 | A | A | A | 4.67 | 3.63 | 2.06 |
| 22 | 98 | 2 | 0.6 | 0.6 | 1.0 | 0 | 0.05 | 3 | A | 95 | A | A | F | 4.44 | 3.36 | 1.74 |
| *23 | 98 | 2 | 0.6 | 0.6 | 1.2 | 0 | 0.05 | 3 | A | 75 | A | F | F | 4.06 | 3.01 | 1.58 |
| 24 | 98 | 2 | 0.6 | 0.1 | 0.6 | 0 | 0.05 | 3 | A | 100 | A | A | A | 4.35 | 3.32 | 2.12 |
| 25 | 98 | 2 | 0.6 | 0.2 | 0.6 | 0 | 0.05 | 3 | A | 100 | A | A | A | 4.40 | 3.11 | 2.00 |
| 26 | 98 | 2 | 0.6 | 1.0 | 0.6 | 0 | 0.05 | 3 | A | 95 | A | A | F | 4.68 | 3.41 | 2.24 |
| *27 | 98 | 2 | 0.6 | 1.2 | 0.6 | 0 | 0.05 | 3 | A | 85 | A | F | F | 4.75 | 3.66 | 2.48 |
| *28 | 98 | 2 | 0.6 | 0.6 | 0.6 | 0.3 | 0.05 | 3 | A | 78 | A | A | A | 4.30 | 3.53 | 1.06 |
| *29 | 98 | 2 | 0.6 | 0.6 | 0.6 | 0.6 | 0.05 | 3 | A | 58 | A | F | F | 4.55 | 3.40 | 0.98 |
| *30 | 98 | 2 | 0.6 | 0.6 | 0.6 | 0.9 | 0.05 | 3 | A | 30 | A | F | F | 4.65 | 3.40 | 1.01 |
| *31 | 98 | 0 | 0.6 | 0.6 | 0.6 | 0 | 0.05 | 3 | A | 50 | F | F | F | 4.05 | 2.95 | 1.44 |
| 32 | 98 | 0.1 | 0.6 | 0.6 | 0.6 | 0 | 0.05 | 3 | A | 100 | A | A | F | 4.23 | 3.28 | 1.88 |
| 33 | 98 | 1 | 0.6 | 0.6 | 0.6 | 0 | 0.05 | 3 | A | 100 | A | A | A | 4.57 | 3.76 | 2.00 |
| 34 | 98 | 3 | 0.6 | 0.6 | 0.6 | 0 | 0.05 | 3 | A | 100 | A | A | A | 4.78 | 3.66 | 1.93 |
| 35 | 98 | 5 | 0.6 | 0.6 | 0.6 | 0 | 0.05 | 3 | A | 100 | A | A | A | 4.69 | 3.81 | 2.14 |

Note:
Sample Nos. marked with * are of comparative examples.

Table 1 shows the test results of examples according to the second aspect of the present invention and comparative examples. Sample Nos. 2 to 6 and 16 which are examples of the aspect of the present invention show the following test results: warp: not greater than 36 $\mu$m; solder wettability: 95 to 100%; soldering heat resistance: 3 to 5 times of dipping; initial bonding strength: 3.94 to 4.43 kgf/2 mm square; bonding strength after 50 hour aging: 2.28 to 2.88 kgf/2 mm square; and bonding strength after 500 hour aging: 1.05 to 1.28 kgf/2 mm square. All of these measurements conform to the criteria for acceptance.

Sample No. 1 which is a comparative example in which 0.1 parts by weight of manganese dioxide is added to the conductive paste shows the following test results that fail to meet the criteria for acceptance: warp: 40 $\mu$m; soldering heat resistance: 1 time of dipping; initial bonding strength: 3.58 kgf/2 mm square; bonding strength after 50 hour aging: 2.10 kgf/2 mm square; and bonding strength after 500 hour aging: 0.86 kgf/2 mm square. This indicates that satisfactory characteristics cannot be obtained when an amount of manganese dioxide added is less than 0.2 parts by weight.

Sample No. 7 which is a comparative example in which 1.2 parts by weight of manganese dioxide is added to the conductive paste shows a solder wettability of 70%, which is not acceptable, while other test results are acceptable. Conceivably, when the amount of manganese dioxide added is in excess of 1.0 part by weight, an excessive amount of manganese dioxide appears on the surface of a surface circuit pattern, thus impairing solder wettability.

Sample Nos. 8 to 11 which are comparative examples in which glass frit is added to the conductive paste show the following unacceptable solder related test results: solder wettability: 30 to 75%; and soldering heat resistance: failure at the first dipping. Conceivably, an excessive amount of glass frit appears on the surface of a surface circuit pattern, thus impairing solder wettability and soldering heat resistance.

As seen from the test results of sample Nos. 12 to 14 which are comparative examples in which bismuth oxide is added to the conductive paste solder wettability and soldering heat resistance deteriorate with the amount of bismuth oxide added. Conceivably, bismuth oxide is more apt to appear on the surface of a surface circuit pattern than is manganese dioxide. The bonding strength as measured after 500 hour aging is less than 1.0 kgf/2 mm square, indicating that aging deterioration is significant.

Sample Nos. 15 to 17 were intended to examine the effect of the total amount of molybdenum and tungsten added on the characteristics of a printed circuit substrate fabricated by use of a conductive paste to which manganese dioxide is added. Sample No. 15 in which the total amount of molybdenum and tungsten added is less than 3 parts by weight shows a considerably large warp of 130 $\mu$m. This indicates that, when the total amount of molybdenum and tungsten added is too small, substrate warpage increases. By contrast, sample No. 17 in which the total amount of molybdenum and tungsten added is greater than 5.6 parts by weight shows a bonding strength less than 1.0 kgf/2 mm square as measured after 500 hour aging. This indicates that, when the total amount of molybdenum and tungsten added is too large, aging deterioration becomes more significant.

Table 2 shows the test results of examples according to the first aspect of the present invention and comparative examples. Sample Nos. 18 to 22 and 24 to 26 which are examples of the aspects of the present invention show the following test results: warp: less than 40 $\mu$m; solder wettability: 95 to 100%; soldering heat resistance: 3 to 5 times of dipping; initial bonding strength: 4.35 to 4.89 kgf/2 mm square; bonding strength after 50 hour aging: 3.11 to 3.76 kgf/2 mm square; and bonding strength after 500 hour aging: 1.35 to 2.24 kgf/2 mm square. All of these measurements conform to the criteria for acceptance.

As seen from the test results of Sample Nos. 24 to 26 (examples) and sample No. 27 (comparative example), solder wettability and soldering heat resistance deteriorate with the amount of copper oxide added. This indicates that the amount of copper oxide added must be rendered not greater than 1.0 part by weight so that all of the tested characteristics conform to the criteria for acceptance.

Sample No. 23 which is a comparative example in which the amount of silicon dioxide added is in excess of 1.0 part by weight shows the following unacceptable solder related test results: solder wettability: 75%; and soldering heat resistance: failure at the first dipping. Conceivably, when the amount of silicon dioxide added is in excess of 1.0 part by weight, an excessive amount of silicon dioxide appears on the surface of a surface circuit pattern, thus impairing soldering characteristics.

As seen from the test results of sample Nos. 28 to 30 which are comparative examples in which glass frit is added to the conductive paste solder wettability and soldering heat resistance deteriorate with the amount of glass frit added. The bonding strength as measured after 500 hour aging also shows a considerable deterioration. Conceivably, aging heat accelerated a deterioration in the bonding strength of a glass bond layer formed by glass frit.

Sample Nos. 31 to 35 were intended to examine the effect of the amount of platinum added on the characteristics of a printed circuit substrate. Among the samples, the amount of platinum added was varied within a range from 0 to 5 parts by weight. Sample No. 31 which is a comparative example in which platinum is not added to the conductive paste shows significant deterioration in solder wettability and soldering heat resistance. By contrast, all of the test results of sample Nos. 32 to 35 which are examples containing platinum in an amount of 0.1 to 5 parts by weight show conformance to the criteria for acceptance. Particularly, the soldering characteristics show a favorable effect of the addition of platinum, which has high heat resistance. The amount of platinum added is limited to not greater than 5 parts by weight; otherwise, the firing temperature of silver-platinum increases 100° C. or more above that of silver, resulting in failure to fire. Also, an increase in the amount of platinum added, which is expensive, results in an increase in fabrication cost. Accordingly, platinum is added in an amount of 0.1 to 5 parts by weight, preferably 0.5 to 3 parts by weight in view of balance between cost and characteristic related advantage.

A ceramic printed circuit substrate fabricated by use of a conductive paste of the present invention can be applied to a microwave circuit chip.

A low-pass filter incorporated coupler as an example of the microwave circuit chip to which the present invention is applied, and an inductance circuit and a capacitance circuit that constitute the coupler will next be described.

FIG. 1 schematically shows a low-pass filter incorporated coupler for use in a cellular phone. As shown in FIG. 1, the low-pass filter incorporated coupler 10 includes eight insulating substrates 12 arranged in layers. Each insulating substrate 12 includes an insulating substrate of the above example and necessary circuit elements formed on a surface of the substrate. The low-pass filter incorporated coupler 10 has a length of 3.2 mm, a width of 1.6 mm, and a height of 1.3 mm. Notably, since FIG. 1 is a schematic view, a longitudinal scale is not identical to a lateral scale. The low-pass filter incorporated coupler 10 has three recesses 11 formed in one side surface and three recesses 11 formed in the other side surface. A conductor 13 is formed on the surface of each recess 11 in order to electrically connect a circuit element on one layer to that on other layer. The conductors 13 are formed of a conductive paste of silver-platinum of the present invention. Notably, conductors on inner layers other than the conductors 13 are formed of silver in order to reduce transmission loss through reduction of electrical resistivity.

Figure 2A:
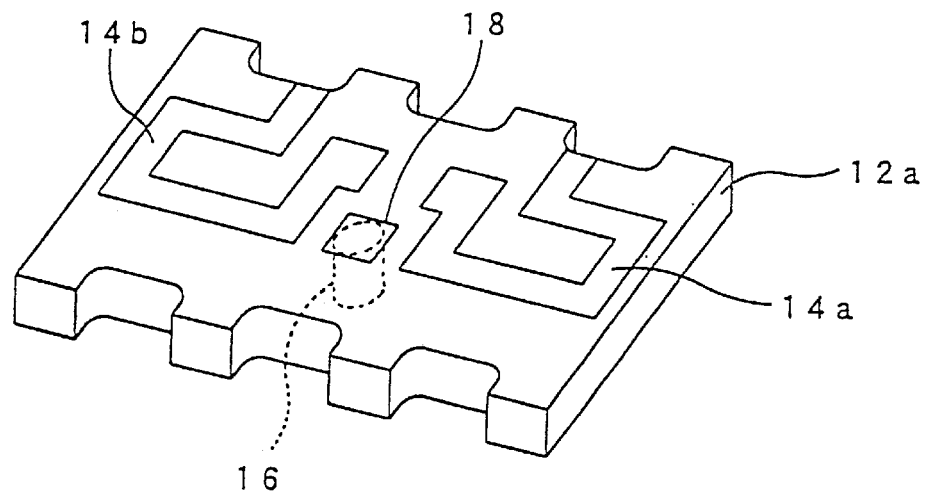
FIG. 2A is a perspective view showing a laminar substrate having inductance circuits formed thereon and used in the low-pass filter incorporated coupler of FIG. 1.
Figure 2B:
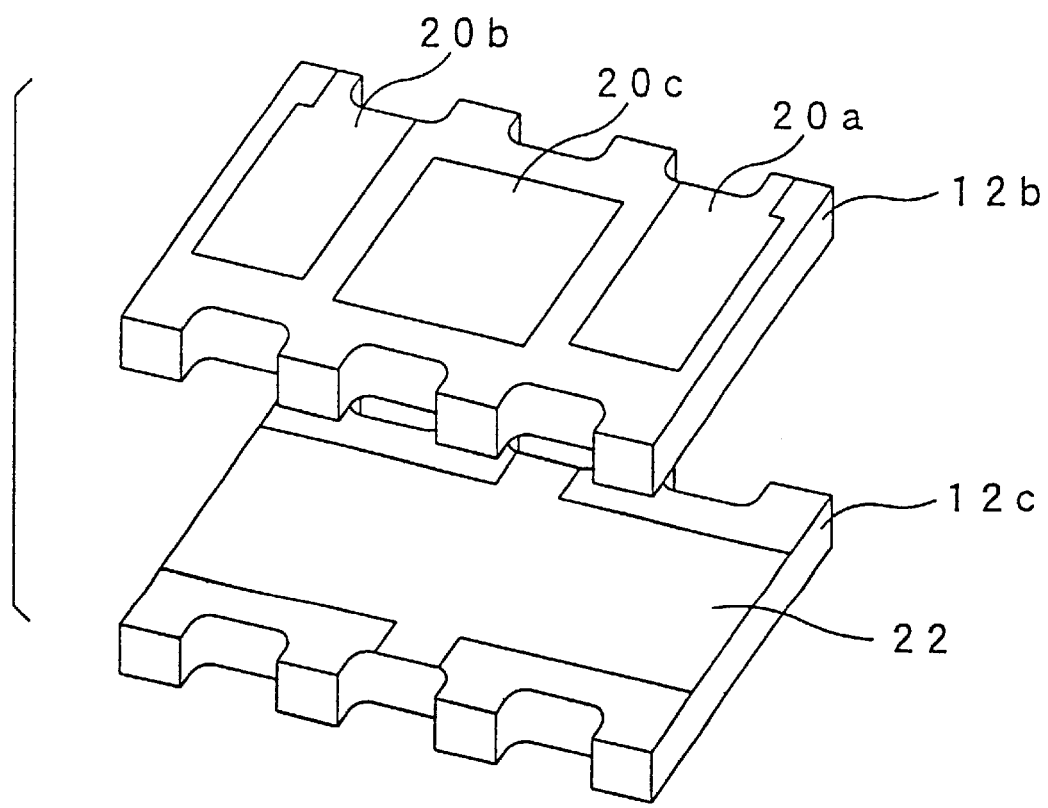
FIG. 2B is a perspective view showing laminar substrates having capacitance circuits formed thereon and used in the low-pass filter incorporated coupler of FIG. 1.

FIGS. 2A and 2B show a substrate having inductance circuits formed thereon and substrates having capacitance circuits formed thereon, respectively, among the laminar substrates of the low-pass filter incorporated coupler shown in FIG. 1.

An insulating substrate 12a shown in FIG. 2A includes inductance circuits 14a and 14b, a via hole conductor 16 serving as an inter-layer conductor, and a contact area 18 electrically connected to the via hole conductor 16. As shown in FIG. 2B, capacitance circuits 20a, 20b and 20c are formed on an insulating substrate 12b shown in FIG. 2B, while a capacitance circuit 22 is formed on an insulating substrate 12c.

The inductance circuits 14a and 14b and the contact area 18 shown in FIG. 2A are electrically connected to circuit elements formed on another insulating substrate to be superposed on the insulating substrate 12a. The via hole conductor 16 is electrically connected to circuit elements formed on another insulating substrate on which the insulating substrate 12a is superposed. Capacitors are formed between the capacitance circuits 20a, 20b, and 20c and the capacitance circuit 22 shown in FIG. 2B.

Figure 3:
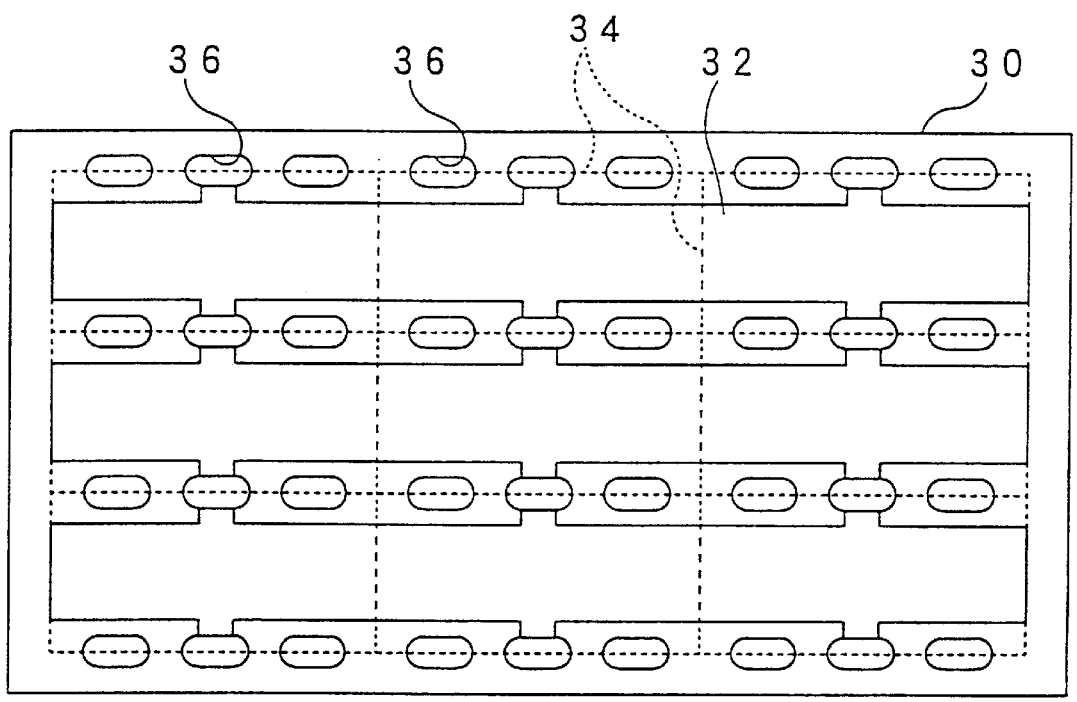
FIG. 3 is a plan view showing a ceramic green sheet from which nine insulating substrates of FIG. 2B are taken.

A method of manufacturing the low-pass filter incorporated coupler 10 will next be described with reference to FIG. 3. FIG. 3 is a plan view of a ceramic green sheet from which nine pieces of the insulating substrate 12c shown in FIG. 2B are taken. A circuit pattern 32 of a silver paste for forming the capacitance circuit is screen printed on a top surface of a green sheet 30. In FIG. 3, dotted lines 34 show cutting lines for separating each insulating substrate. Through-holes 36 for forming the recesses 11 shown in FIG. 1 are punched along the dotted lines 34.

Eight green sheets, each bearing circuit patterns of FIG. 2A or FIG. 2B, are laminated. Subsequently, a conductive paste of silver-platinum is applied to the inner wall surface of each through hole 36 by means of screen printing. Subsequently, the resultant green sheet laminate is cut along the dotted lines 34 shown in FIG. 3, obtaining green substrates. Then, the green substrates are fired, thereby simultaneously firing the insulating substrates and circuit patterns formed of the conductive paste of silver-platinum. The low-pass filter incorporated coupler 10 shown in FIG. 1 is thus obtained.

Figure 4:
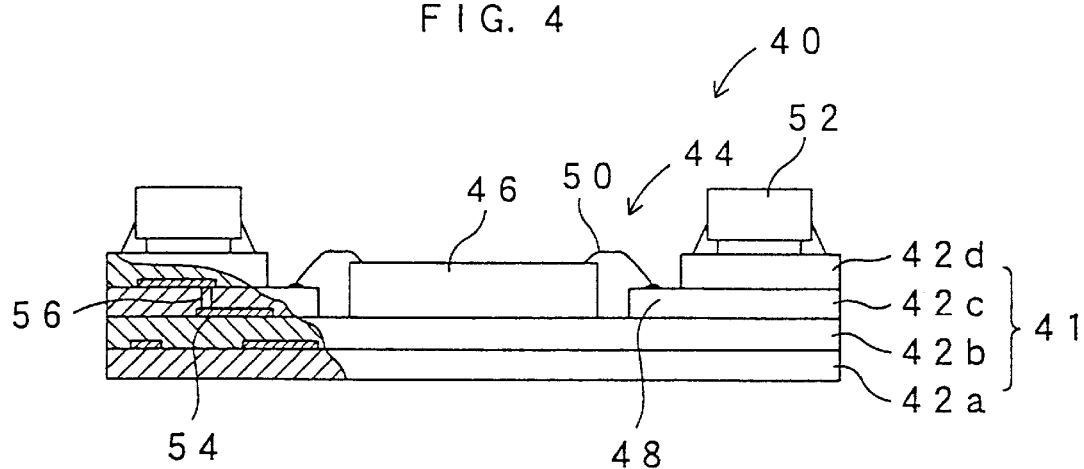
FIG. 4 is a side view in partial section showing a power amplifier to which the present invention is applied.

FIG. 4 is a partially cut-away side view showing a power amplifier 40 to which the present invention is applied. As shown in FIG. 4, the power amplifier 40 includes four insulating substrates 42a to 42d arranged in layers. A cavity 44 is provided in a central portion of a laminate substrate 41. Insulating substrates 42c, 42d in the area of the cavity 44 form a double layer structure. The semiconductor chip 46 with an integrated circuit formed thereon is brazed, by use of a gold-tin brazing material, onto a silver-platinum conductor of the present invention formed on the insulating substrate 42b which defines the cavity 44A, thereby mounting the semiconductor chip 46 on the insulating substrate 42b. The semiconductor chip 46 and a step portion 48 surrounding the cavity 44 are electrically interconnected via bonding wires 50. A chip component 52, such as a resistor, is soldered onto a silver-platinum conductor of the present invention formed on an uppermost layer, or a fourth insulating substrate 42d. A wiring layer 54 and a via hole conductor 56, which are formed of silver, are provided inside the laminate substrate 41.

A method of manufacturing a laminate substrate for use in the power amplifier 40 will be described. Then, a method of manufacturing the power amplifier 40 will next be described.

A 0.15 mm thick master green sheet is formed in a manner similar to that in the example described previously. The master green sheet is cut into green sheets, each having a size of 100 mm×100 mm. Necessary circuit patterns are printed in a matrix manner on each green sheet using a conductive paste of Ag for formation of a circuit pattern on an inner layer and a conductive paste of silver-platinum of the present invention for formation of a circuit pattern on an outermost layer by the screen printing process. Moreover, through-holes for forming the step portion 48 and the cavity 44 are formed in a matrix manner in green sheets of third and fourth layers from the bottom. Subsequently, the green sheets with the circuit patterns printed thereon are laminated. The resultant laminate is fired, thereby simultaneously firing the green sheets and the circuits formed of the silver or silver-platinum paste. The resultant fired large sized laminate substrate is shown in FIGS. 6 to 8.

Figure 6:
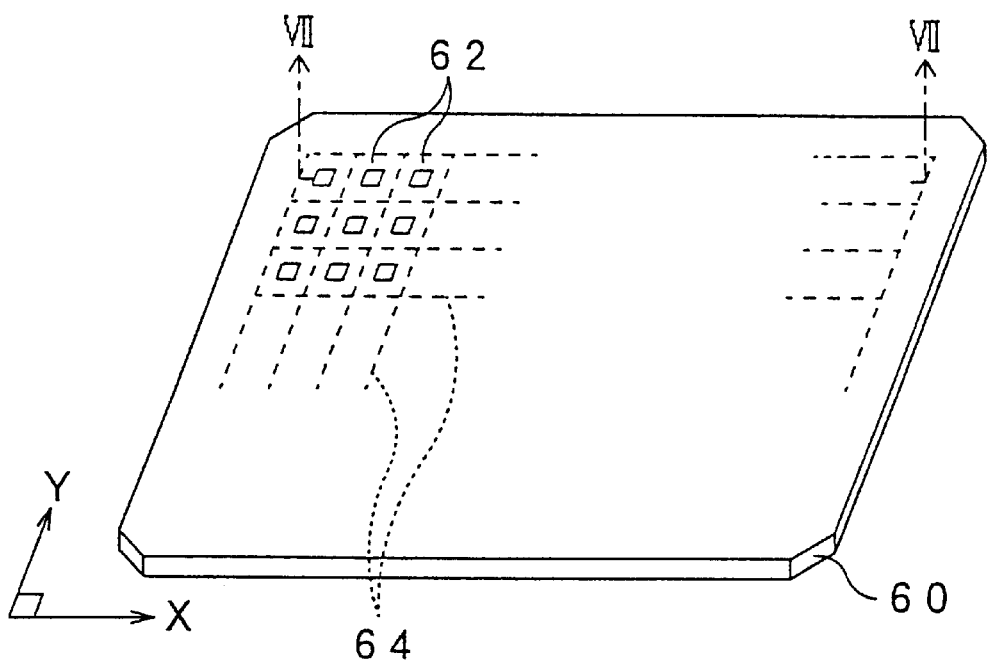
FIG. 6 is a perspective view showing a large sized laminate substrate to which the present invention is applied.

As shown in FIG. 6, a large sized laminate substrate 60 has a large number of chip areas 62, which are arranged in a matrix manner in X and Y directions orthogonal to each other. The laminate substrate 60 is cut along cutting lines 64 represented by dotted lines, yielding a large number of substrates for use in fabrication of power amplifiers.

Figure 7:
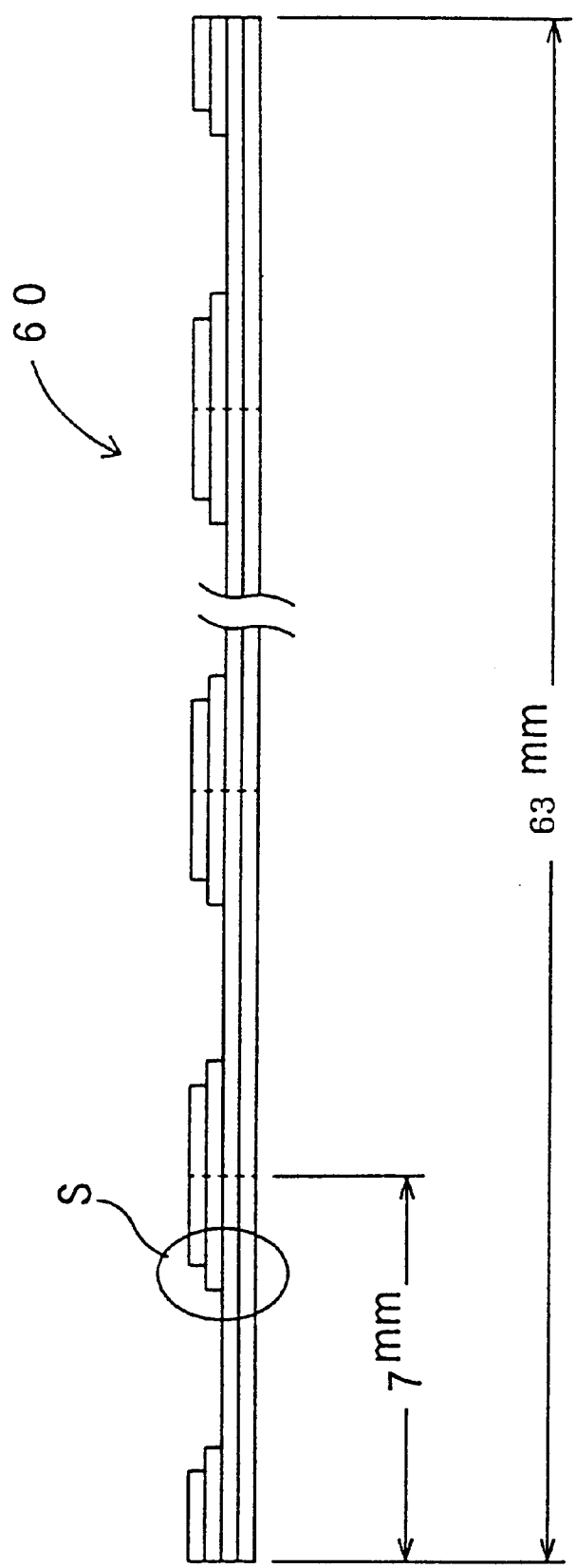
FIG. 7 is a sectional view taken along line VII—VII of FIG. 6.

FIG. 7 is a sectional view taken along line VII—VII shown in FIG. 6. As shown in FIG. 7, the laminate substrate 60 excluding edge portions has a length of 63 mm, while one chip area 62 has a length of 7 mm. The entire laminate substrate 60 has a length of 75 mm.

Figure 8:
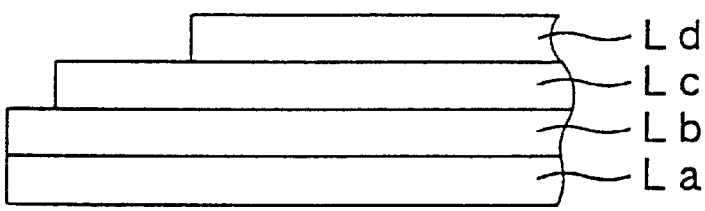
FIG. 8 is an enlarged view showing a portion S of FIG. 7.

FIG. 8 is an enlarged view of a portion S shown in FIG. 7. As shown in FIG. 8, the laminate substrate 60 includes layers La, Lb, Lc and Ld. Each layer has a silver metallization layer formed thereon so as to form, for example, metal wiring or pads from the metallization layer. A metallization layer of silver-platinum of the present invention is formed on the lower surface of the layer La, and a silver metallization layer is formed on the upper surface thereof. A metallization layer of silver-platinum of the present invention is formed on the upper surfaces of the layers Lb, Lc and Ld. Moreover, the lower surface of the layer La and exposed portions of the layers Lb, Lc and Ld are coated with a ceramic coat so as to cover and insulate the metallization layers. As described above, the laminate substrate 60 is formed by laminating a plurality of insulating substrates, each being metallized with silver or silver-platinum, followed by firing. Through employment of the composition of the insulating substrate falling within the range of the present invention as described previously, physical properties of the insulating substrate match those of the conductive layer. Therefore, even when the large sized laminate substrate 60 is prepared and fired as described previously, the fired substrate 60 is substantially free of warpage or deformation.

Subsequently, IC chips and chip components are mounted on the large sized laminate substrate 60. An electromagnetic shielding metal cap (not shown) is attached to each chip area 62. Then, the large sized laminate substrate 60 is cut along the dotted lines 64 shown in FIG. 6, thereby yielding a large number of power amplifier components.

Figure 5:
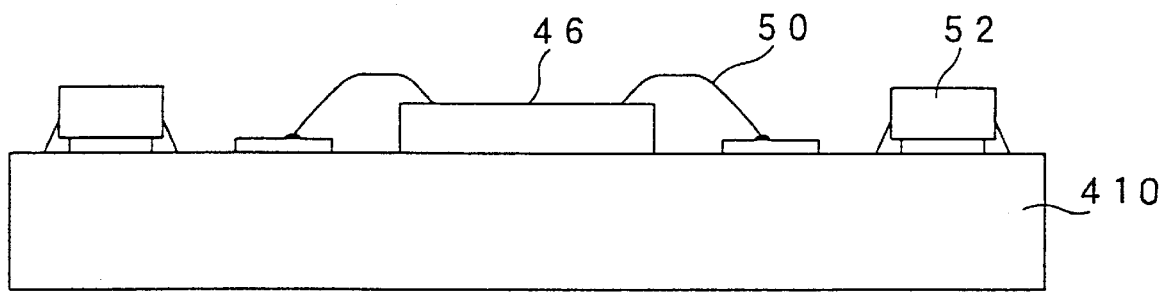
FIG. 5 is a side view showing a prior art power amplifier.

The power amplifier 40 shown in FIG. 4 is more compact as compared to the conventional, prior art power amplifier shown in FIG. 5. Since the conventional power amplifier substrate is formed of a monolayer substrate 410, wiring and circuit elements can be formed only on a substrate surface, thereby requiring a large area. The laminate substrate to which the present invention is applied permits formation of wiring and, if necessary, circuit elements inside the substrate, so that an obtained power amplifier can be more compact than the conventional power amplifier.

As described above, the laminate substrate having therein metallization layers of silver-platinum of the present invention is substantially free of warpage or deformation even when assuming a large size. For example, a warp in the large sized laminate substrate 60 which is of four layers and measures 75 mm×75 mm as measured after firing is not greater than 40 μm. Therefore, such a large sized laminate substrate enables highly efficient fabrication of power amplifiers therefrom and fabrication of compact power amplifiers.

Applications of the present invention are described above while mentioning the low-pass filter incorporated coupler and the power amplifier. However, the present invention can also be applied to filter circuit chips, such as low-pass filters and high-pass filters, as well as other microwave circuit chips.

The present invention is not to be limited to the details giving herein, but may be modified within the scope of the appended claims.

What is claimed is:

1. A conductive paste, comprising: 100 parts by weight of silver-platinum; 0.2 to 1 part by weight of manganese dioxide; 0.2 to 1 part by weight of copper oxide; 0.3 to 1 part by weight of silicon dioxide; and 3 to 5.6 parts by weight of molybdenum and tungsten powder.

2. The conductive paste according to claim 1, further including a glass ceramic substrate and wherein said conductive paste forms a surface circuit pattern on said glass ceramic substrate.

3. A conductive paste, comprising: 100 parts by weight of silver-platinum; 0.2 to 1 part by weight of manganese dioxide; 0.2 to 1 part by weight of copper oxide; 0.3 to 1 part by weight of silicon dioxide having a specific surface area of not less than 50 m$^2$/g as measured by a BET method, an average primary grain size of 5 to 50 nm and a purity not lower than 99.8%; and 3 to 5.6 parts by weight of molybdenum and tungsten powder.

4. The conductive paste according to claim 3, further including a glass ceramic substrate and wherein said conductive paste forms a surface circuit pattern on said glass ceramic substrate.

5. A ceramic printed circuit substrate, comprising:

an insulation portion formed of glass ceramic containing lead borosilicate glass as a glass component; and a circuit portion containing silver as a main component, at least part of said circuit portion being formed by use of a conductive paste comprising 100 parts by weight of silver-platinum, 0.2 to 1 part by weight of manganese dioxide, 0.2 to 1 part by weight of copper oxide, 0.3 to 1 part by weight of silicon dioxide, and 3 to 5.6 parts by weight of molybdenum and tungsten powder.

6. A ceramic printed circuit substrate, comprising:

an insulation portion formed of glass ceramic containing lead borosilicate glass as a glass component; and a circuit portion containing silver as a main component, at least part of said circuit portion being formed by use of a conductive paste comprising 100 parts by weight of silver-platinum, 0.2 to 1 part by weight of manganese dioxide, 0.2 to 1 part by weight of copper oxide, 0.3 to 1 part by weight of silicon dioxide having a specific surface area of not less than 50 m$^2$/g as measured by a BET method, an average primary grain size of 5 to 50 nm and a purity not lower than 99.8%, and 3 to 5.6 parts by weight of molybdenum and tungsten powder.

* * * * *